(12) United States Patent
Kato

(10) Patent No.: US 7,687,866 B2
(45) Date of Patent: Mar. 30, 2010

(54) SEMICONDUCTOR DEVICE AND METHOD OF MANUFACTURING SEMICONDUCTOR DEVICE

(75) Inventor: Juri Kato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 661 days.

(21) Appl. No.: 11/535,850

(22) Filed: Sep. 27, 2006

(65) Prior Publication Data

US 2007/0075380 A1 Apr. 5, 2007

(30) Foreign Application Priority Data

| Sep. 30, 2005 | (JP) | ............................. 2005-288881 |
| Sep. 30, 2005 | (JP) | ............................. 2005-288882 |
| Jul. 10, 2006 | (JP) | ............................. 2006-189025 |

(51) Int. Cl.
*H01L 29/76* (2006.01)
(52) U.S. Cl. ..................... 257/384; 257/192; 257/332
(58) Field of Classification Search ................ 257/384, 257/192, 331–369
See application file for complete search history.

(56) References Cited

U.S. PATENT DOCUMENTS 6,888,181 B1 * 5/2005 Liao et al. .................. 257/192

OTHER PUBLICATIONS

Tsu-Jae King, "Extended Abstract of the 2003 International Conference on Solid State Devices and Materials," Tokyo; 2003; pp. 280-281; Department of Electrical Engineering and Computer Sciences, University of California, Berkeley, California.

* cited by examiner

*Primary Examiner*—Thinh T Nguyen
(74) *Attorney, Agent, or Firm*—Oliff & Berridge, PLC

(57) ABSTRACT

A semiconductor device includes a semiconductor layer formed partially on a semiconductor substrate by epitaxial growth, an embedded oxide film embedded between the semiconductor substrate and the semiconductor layer, first and second gate electrodes disposed on sidewalls of the semiconductor layer, a source layer formed in the semiconductor layer and disposed in the first gate electrode, and a drain layer formed in the semiconductor layer and disposed in the second gate electrode, wherein the sidewalls of the semiconductor layer are film-forming surfaces of the epitaxial growth.

4 Claims, 14 Drawing Sheets

SEMICONDUCTOR DEVICE AND METHOD OF MANUFACTURING SEMICONDUCTOR DEVICE

BACKGROUND OF THE INVENTION

1. Technical Field

The present invention relates to a semiconductor device and a method of manufacturing a semiconductor device, and in particular, it is preferably applied to a field-effect transistor having a channel on the sidewall of the semiconductor layer.

2. Related Art

In a semiconductor device of the related art, there is disclosed a method of enhancing the integration density of the transistor while assuring a current drive capability by forming a fin structure of Si on a Si substrate and disposing a gate electrode along the sidewall of the fin (see, for example, Extended Abstract of the 2003 International Conference on Solid State Device and Materials, Tokyo, 2003, pp. 280-281).

However, in the fin type transistor in the related art, the fin structure forming the channel region is formed by a dry etching process using a resist pattern as the mask. Therefore, since damage by the dry etching process causes a defect in the channel region resulting in increase in the interface state and degradation in the mobility, the electrical characteristics of the field-effect transistor is problematically degraded. Further, since the fin structure forming the channel region is formed by a photo etching process, variation in the thickness of the fin is easily caused, and moreover, the thickness of the fin forming the channel region is limited due to the exposure wavelength. Therefore, thinning of the fin is problematically limited.

SUMMARY

An advantage of the invention is to provide a semiconductor device and a method of manufacturing a semiconductor device capable of forming the channel on the sidewall of the semiconductor layer, preventing the damage in the channel region, and stably controlling the thickness of the semiconductor layer to which the channel is formed.

According to an aspect of the invention, a semiconductor device includes; a semiconductor layer formed partially on a semiconductor substrate by epitaxial growth; an embedded oxide film embedded between the semiconductor substrate and the semiconductor layer; gate electrodes disposed on sidewalls of the semiconductor layer; a source layer formed in the semiconductor layer and disposed on one of the gate electrodes; and a drain layer formed in the semiconductor layer and disposed on the other of the gate electrodes. The sidewalls of the semiconductor layer are film-forming surfaces of the epitaxial growth.

Thus, the channel can be disposed on the sidewall (i.e., the film-forming surface of the epitaxial growth) of the semiconductor layer formed by the epitaxial growth. Therefore, even in the case in which the cannel is provided to the sidewall of the semiconductor layer, it becomes possible to prevent the damage from extending to the channels to prevent the defect form generating in the channel region, thus preventing increase in the interface state and degradation in the mobility in the channel region. As a result, the integration density of the transistor can be enhanced while keeping the current drive capability, and stable and superior electrical characteristics can be obtained.

Further, even in the case in which the channel is provided to the sidewall of the semiconductor layer, the thickness of the semiconductor layer on which the channel is formed can be controlled by the epitaxial growth, thus the thickness control of the semiconductor layer can stably be performed while achieving the thinner semiconductor layer. Further, by embedding the embedded oxide film between the semiconductor substrate and the semiconductor layer, the source/drain junction capacitance can be reduced while preventing latch-up phenomenon, thus lower power consumption and higher speed can be achieved, and further, low voltage drive can easily be realized.

Further, in a semiconductor device according to another aspect of the invention, the gate electrode is formed on the sidewalls of the both sides of the semiconductor layer so as to straddle the semiconductor layer.

Thus, it becomes possible to drive the transistor from the both sides of the semiconductor layer while allowing the film-forming surface provided to the sidewall of the semiconductor layer to have the channel. Therefore, it becomes possible to increase the current drive capability while allowing the enhancement of the integration density of the transistor.

Further, in a semiconductor device according to another aspect of the invention, the semiconductor layer has a lug shape, a fin shape, a grid shape or a net shape.

Thus, by disposing the gate electrode so as to straddle the semiconductor layer, it becomes possible to drive the transistor from the both sides of the semiconductor layer while allowing the film-forming surface provided to the sidewall of the semiconductor layer to have the channel. Therefore, it becomes possible to increase the current drive capability while preventing the manufacturing process from being complex, and to enhance the integration density of the transistor.

Further, a method of manufacturing a semiconductor device according to another aspect of the invention includes the step of forming a lug shaped semiconductor layer on a semiconductor substrate, the step of forming sidewalls for preventing oxidation on sidewalls of the lug shaped semiconductor layer, the step of forming an embedded oxide film embedded between the lug shaped semiconductor layer and the semiconductor substrate by performing selective oxidation of the lug shaped semiconductor layer and the semiconductor substrate using the sidewalls for preventing oxidation as a mask, the step of forming a gate electrode on the sidewalls of the lug shaped semiconductor layer after removing the sidewalls for preventing oxidation, and the step of forming in the lug shaped semiconductor layer a source layer disposed on one of the gate electrode and a drain layer disposed on the other of the gate electrode.

Thus, by performing the selective oxidation of the lug shaped semiconductor layer and the semiconductor substrate using the sidewalls for preventing oxidation as a mask, the lug shaped semiconductor layer can be disposed on the embedded oxide film without using the SOI substrate, and the channel can also be formed on the sidewalls of the lug shaped semiconductor layer. Therefore, it becomes possible to enhance the integration density of the transistors while keeping the current drive capability, and further, it becomes also possible to reduce the source/drain junction capacitance, thus the low power consumption and speeding up of the field-effect transistors can be achieved.

Further, a method of manufacturing a semiconductor device according to another aspect of the invention includes the step of forming a first semiconductor layer on a semiconductor substrate by epitaxial growth, the step of exposing sidewalls of the first semiconductor layer by patterning the first semiconductor layer formed on the semiconductor substrate, the step of forming a second semiconductor layer on the sidewalls of the first semiconductor layer by epitaxial growth, the step of removing the first semiconductor layer from the semiconductor substrate while keeping the second semiconductor layer on the semiconductor substrate, the step of forming sidewalls for preventing oxidation on the sidewalls of the second semiconductor layer, the step of forming an embedded oxide film embedded between the second semiconductor layer and the semiconductor substrate by performing selective oxidation of the second semiconductor layer and the semiconductor substrate using the sidewalls for preventing oxidation as a mask, the step of forming a gate electrode on a film-forming surface of the second semiconductor layer after removing the sidewalls for preventing oxidation, and the step of forming in the second semiconductor layer a source layer disposed on one of the gate electrode and a drain layer disposed on the other of the gate electrode.

Thus, the epitaxial growth of the second semiconductor layer on the sidewall of the first semiconductor layer becomes possible, and it becomes also possible to have a channel on the film surface of the second semiconductor layer formed on the sidewall of the first semiconductor layer. Further, the second semiconductor layer can be disposed on the embedded oxide film by performing the selective oxidation of the second semiconductor layer and the semiconductor substrate using the sidewalls for preventing oxidation as a mask without using an SOI substrate. Therefore, even in the case in which the channel is provided on the sidewall of the second semiconductor layer, the insulation between the second semiconductor layer and the semiconductor substrate can be achieved while preventing the damage by the dry etching process from extending over the channel, and the film thickness of the second semiconductor layer on which the channel is formed can be controlled with the epitaxial growth. As a result, it becomes possible to prevent defect from being generated in the channel region, and further, even in the case in which the channel is provided on the sidewall of the second semiconductor layer, the stable thickness control of the second semiconductor layer becomes possible while achieving the thinned second semiconductor layer. Moreover, the integration density of the transistors can be enhanced while keeping the current driving capacity, and further, stable and superior electrical characteristics can be obtained.

Further, a semiconductor device according to another aspect of the invention includes a semiconductor layer having channels in sidewall faces, gate electrodes formed on the sidewalls of both sides of the semiconductor layer so as to straddle the semiconductor layer, a source layer formed in the semiconductor layer and disposed in a side of one of the gate electrodes, and a drain layer formed in the semiconductor layer and disposed in a side the other of the gate electrodes, wherein the gate electrode formed on one of the sidewalls and the gate electrode formed on the other of the sidewalls out of the gate electrodes formed on the both of the sidewalls of the semiconductor layer have different polarities from each other.

In an embodiment of the invention, the polarity of P/N and the concentration of impurities are set independently to the gate electrode on one side face (side A) of the fin type MOSFET and the gate electrode on the back side face (side B) of the MOSFET. Further, the semiconductor layer for forming the channel is composed of the intrinsic or low-concentration impurities. Still further, the potential of the fin type semiconductor layer for forming the channel region is determined by the work function of the gate electrodes on both of the surfaces of side A and side B. Therefore, by connecting the gate electrodes on the side A and side B to each other, even if the fin type semiconductor layer is composed of the intrinsic or low-concentration impurities, the threshold value can be controlled to be changed in a range of about one volt by selecting the polarities of the gate electrodes on the both of side A and side B. Therefore, all of the MOSFET with P channel or N channel having high/low threshold for composing the fin type CMOS-LSI can be realized with the extremely low concentration fin type semiconductor layer. The channel region formed of the low concentration semiconductor layer ensures the high mobility, and realizes the steep sub-threshold characteristic even with a thicker fin type semiconductor layer. Accordingly, the embodiment of the invention can provide a semiconductor device free from the degradation of the on-current.

Further, a semiconductor device according to another aspect of the invention includes a semiconductor layer having a film-forming faces on sidewalls formed on a semiconductor substrate by epitaxial growth, an embedded oxide film embedded between the semiconductor substrate and the semiconductor layer, gate electrodes formed on the sidewalls of both sides of the semiconductor layer so as to straddle the semiconductor layer, a source layer formed in the semiconductor layer and disposed in a side of one of the gate electrodes, and a drain layer formed in the semiconductor layer and disposed in a side the other of the gate electrodes, wherein the gate electrode formed on one of the sidewalls and the gate electrode formed on the other of the sidewalls out of the gate electrodes formed on the both of the sidewalls of the semiconductor layer have different polarities from each other.

Thus, the channel can be disposed on the film-forming surface formed by the epitaxial growth with the channel held on the sidewall of the semiconductor layer. Therefore, even in the case in which the cannel is provided to the sidewall of the semiconductor layer, it becomes possible to prevent the damage from extending to the channels to prevent the defect form generating in the channel region, thus preventing increase in the interface state and degradation in the mobility in the channel region. As a result, the integration density of the transistor can be enhanced while keeping the current drive capability, and stable and superior electrical characteristics can be obtained.

Further, even in the case in which the channel is provided to the sidewall of the semiconductor layer, the thickness of the semiconductor layer on which the channel is formed can be controlled by the epitaxial growth, thus the thickness control of the semiconductor layer can stably be performed while achieving the thinner semiconductor layer. Further, by embedding the embedded oxide film between the semiconductor substrate and the semiconductor layer, the source/drain junction capacitance can be reduced while preventing latch-up phenomenon, thus lower power consumption and higher speed can be achieved, and further, low voltage drive can easily be realized.

Further, by forming the impurity layers set to be different in the concentrations or the polarities for every sidewall face of the semiconductor layer in the gate electrodes, the potentials of the semiconductor layer in the both side faces and the body region can be determined by the gate electrodes disposed on the both side faces of the semiconductor layer. Therefore, it becomes possible to lower the impurity concentration of the semiconductor layer while allowing stable threshold control of the transistor disposed on the sidewalls of the semiconductor layer, thus enhancing the mobility of the field-effect transistor and increasing the on-current. Further, since the impurity concentration of the semiconductor layer can be lowered, even in the case in which the semiconductor layer is formed as a thick film, it becomes possible to obtain a steep sub-threshold to allow reduction of the characteristic variation, which allows enhancing manufacturing yield to realize cost reduction.

Further, in a semiconductor device according to another aspect of the invention, the semiconductor layer has a lug shape, a fin shape, a grid shape or a net shape.

Thus, by disposing the gate electrode so as to straddle the semiconductor layer, it becomes possible to drive the transistor from the both sides of the semiconductor layer while allowing the film-forming surface provided to the sidewall of the semiconductor layer to have the channel. Therefore, it becomes possible to increase the current drive capability while preventing the manufacturing process from being complex, and to enhance the integration density of the transistor.

Further, in a semiconductor device according to another aspect of the invention, the gate electrodes has one of a polysilicon layer and a silicide layer, and the gate electrodes on the sidewalls of both sides of the semiconductor layer are connected to each other with a silicide layer.

Accordingly, even in the case in which the body region of the semiconductor layer is intrinsically doped or doped in low concentration, the threshold value can be changed in a range of about one volt by appropriately selecting the polarities of the gate electrodes on the sidewalls of the both sides of the semiconductor layer, thus enhancing the mobility of the field-effect transistor, and increasing the on-current.

Further, a method of manufacturing a semiconductor device according to another aspect of the invention includes the step of forming a lug shaped semiconductor layer on a semiconductor substrate, the step of forming a film with a gate electrode material on the lug shaped semiconductor layer so as to cover an upper surface and sidewalls of the lug shaped semiconductor layer, the step of forming impurity introduction layers in one and the other of the sidewalls of the lug shaped semiconductor layer facing each other to form a pair set to be different from each other in one of concentration and polarity in the gate electrode material by performing tilted ion-implantation on the gate electrode material, the step of forming gate electrodes on the pair of opposing sidewalls of the lug shaped semiconductor layer so as to straddle the lug shaped semiconductor layer by patterning the gate electrode material, and the step of forming in the lug shaped semiconductor layer a source layer disposed on one of the gate electrode and a drain layer disposed on the other of the gate electrode.

Further, a method of manufacturing a semiconductor device according to another aspect of the invention includes the step of forming a lug shaped semiconductor layer on a semiconductor substrate, the step of forming sidewalls for preventing oxidation on sidewalls of the lug shaped semiconductor layer, the step of forming an embedded oxide film embedded between the lug shaped semiconductor layer and the semiconductor substrate by performing selective oxidation of the lug shaped semiconductor layer and the semiconductor substrate using the sidewalls for preventing oxidation as a mask, the step of forming a film with a gate electrode material on the lug shaped semiconductor layer so as to cover an upper surface and the sidewalls of the lug shaped semiconductor layer after removing the sidewalls for preventing oxidation, the step of forming impurity introduction layers in one and the other of the sidewalls of the lug shaped semiconductor layer facing each other to form a pair set to be different from each other in one of concentration and polarity in the gate electrode material by performing tilted ion-implantation on the gate electrode material, the step of forming gate electrodes on the sidewall of the both sides of the lug shaped semiconductor layer so as to straddle the lug shaped semiconductor layer by patterning the gate electrode material, and the step of forming in the lug shaped semiconductor layer a source layer disposed on one of the gate electrode and a drain layer disposed on the other of the gate electrode.

Thus, by performing the selective oxidation of the lug shaped semiconductor layer and the semiconductor substrate using the sidewalls for preventing oxidation as a mask, the lug shaped semiconductor layer can be disposed on the embedded oxide film without using the SOI substrate, and the channel can also be formed on the sidewalls of the lug shaped semiconductor layer. Therefore, it becomes possible to enhance the integration density of the transistors while keeping the current drive capability, and further, it becomes also possible to reduce the source/drain junction capacitance, thus the low power consumption and speeding up of the field-effect transistors can be achieved.

Further, by implanting the impurities into the gate electrode material using tilted ion-implanting process, the concentration or the polarities of the impurity introduction layer can be set in a self-aligning manner to be different in every sidewall face of the lug shaped semiconductor layer. Therefore, even in the case in which the impurity concentration of the semiconductor layer is set lower, it becomes possible to stably perform the threshold control of the transistors disposed on the sidewalls of the semiconductor layer while preventing the manufacturing process from becoming complex, thus enhancing the mobility of the field-effect transistors and increasing the on-current while preventing increase in cost.

Further, a method of manufacturing a semiconductor device according to another aspect of the invention includes the step of forming a first semiconductor layer on a semiconductor substrate by epitaxial growth, the step of exposing sidewalls of the first semiconductor layer by patterning the first semiconductor layer formed on the semiconductor substrate, the step of forming a second semiconductor layer on the sidewalls of the first semiconductor layer by epitaxial growth, the step of removing the first semiconductor layer from the semiconductor substrate while keeping the second semiconductor layer on the semiconductor substrate, the step of forming sidewalls for preventing oxidation on the sidewalls of the second semiconductor layer, the step of forming an embedded oxide film embedded between the second semiconductor layer and the semiconductor substrate by performing selective oxidation of the second semiconductor layer and the semiconductor substrate using the sidewalls for preventing oxidation as a mask, the step of forming a film with a gate electrode material so as to cover an upper surface and the sidewalls of the second semiconductor layer after removing the sidewalls for preventing oxidation, the step of forming impurity introduction layers in at least one of the sidewalls of the second semiconductor layer set to be different between an outer sidewall face and an inner sidewall face of the at least one of the sidewalls in one of concentration and polarity in the gate electrode material by performing tilted ion-implantation on the gate electrode material, the step of forming gate electrodes on the sidewalls of the both sides of the second semiconductor layer including at least one of the sidewalls so as to straddle the second semiconductor layer by patterning the gate electrode material, and the step of forming in the second semiconductor layer a source layer disposed on one of the gate electrode and a drain layer disposed on the other of the gate electrode.

Thus, the epitaxial growth of the second semiconductor layer on the sidewall of the first semiconductor layer becomes possible, and it becomes also possible to have a channel on the film surface of the second semiconductor layer formed on the sidewall of the first semiconductor layer. Further, the second semiconductor layer can be disposed on the embedded oxide film by performing the selective oxidation of the second semiconductor layer and the semiconductor substrate using the sidewalls for preventing oxidation as a mask without using an SOI substrate. Therefore, even in the case in which the channel is provided on the sidewall of the second semiconductor layer, the insulation between the second semiconductor layer and the semiconductor substrate can be achieved while preventing the damage by the dry etching process from extending over the channel, and the film thickness of the second semiconductor layer on which the channel is formed can be controlled with the epitaxial growth. As a result, it becomes possible to prevent defect from being generated in the channel region, and further, even in the case in which the channel is provided on the sidewall of the second semiconductor layer, the stable thickness control of the second semiconductor layer becomes possible while achieving the thinned second semiconductor layer. Moreover, the integration density of the transistors can be enhanced while keeping the current driving capacity, and further, stable and superior electrical characteristics can be obtained.

Further, by setting the concentration or the polarities of the impurity introduction layers to be different in every sidewall face of the lug shaped semiconductor layer, even in the case in which the impurity concentration of the semiconductor layer is set lower, it becomes possible to stably perform the threshold control of the transistors disposed on the sidewalls of the semiconductor layer while preventing the manufacturing process from becoming complex, thus enhancing the mobility of the field-effect transistors and increasing the on-current while preventing increase in cost.

Further, a method of manufacturing a semiconductor device according to another aspect of the invention includes the step of exposing sidewalls of a semiconductor layer by patterning the semiconductor layer formed on an insulator, the step of forming a film with a gate electrode material so as to cover an upper surface and sidewalls of the semiconductor layer, the step of forming impurity introduction layers in one and the other of the sidewalls of the semiconductor layer facing each other to form a pair set to be different from each other in one of concentration and polarity in the gate electrode material by performing tilted ion-implantation on the gate electrode material, the step of forming gate electrodes on the pair of opposing sidewalls of the semiconductor layer so as to straddle the semiconductor layer by patterning the gate electrode material, and the step of forming in the second semiconductor layer a source layer disposed on one of the gate electrode and a drain layer disposed on the other of the gate electrode.

Accordingly, by setting the concentration or the polarities of the impurity introduction layers to be different in every sidewall face of the lug shaped semiconductor layer, even in the case in which the impurity concentration of the semiconductor layer is set lower, it becomes possible to stably perform the threshold control of the transistors disposed on the sidewalls of the semiconductor layer while preventing the manufacturing process from becoming complex, thus enhancing the mobility of the field-effect transistors and increasing the on-current while preventing increase in cost.

BRIEF DESCRIPTION OF THE DRAWINGS

The invention will now be described with reference to the accompanying drawings, wherein like numbers refer to like elements.

DESCRIPTION OF THE EXEMPLARY EMBODIMENTS

A semiconductor device and a method of manufacturing the semiconductor device according to an embodiment of the invention will hereinafter be described with reference to the accompanying drawings.

First Embodiment

FIGS. 1A, 2A, 3A, 4A, 5A, 6A, 7A, 8A, 9A, 10A, and 11A are perspective views showing a method of manufacturing a semiconductor device according to a first embodiment of the invention, FIGS. 1B, 2B, 3B, 4B, 5B, 6B, 7B, 8B, 9B, 10B, and 11B are cross sectional views along the A1-A1' line through A11-A11' line in FIGS. 1A, 2A, 3A, 4A, 5A, 6A, 7A, 8A, 9A, 10A, and 11A, respectively, FIGS. 1C, 2C, 3C, 4C, 5C, 6C, 7C, 8C, 9C, 10C, and 11C are cross sectional views along the B1-B1' line through B11-B11' line in FIGS. 1A, 2A, 3A, 4A, 6A, 6A, 7A, 8A, 9A, 10A, and 11A, respectively.

Figure 1A:
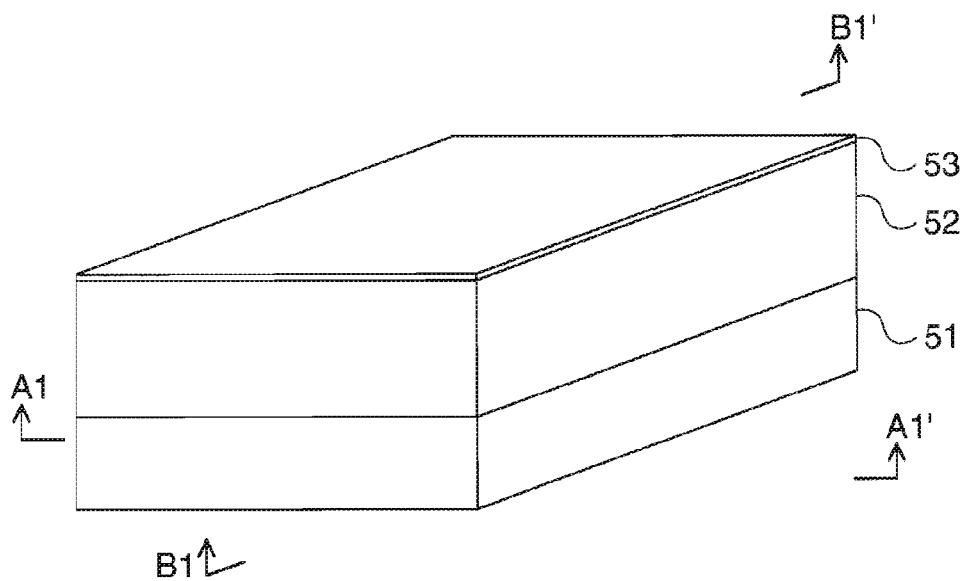
FIGS. 1A through 1C are diagrams showing a method of manufacturing a semiconductor device according to a first embodiment of the invention.
Figure 1B:
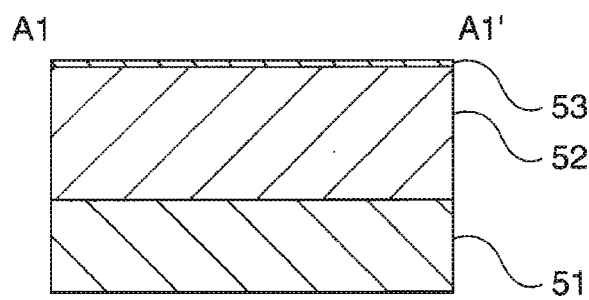
Figure 1C:
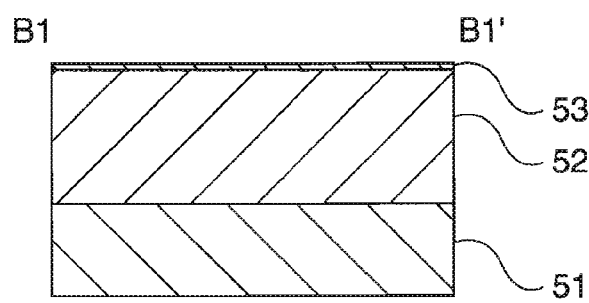

In FIGS. 1A through 1C, a first semiconductor layer 52 is formed as a film on a semiconductor substrate 51 by epitaxial growth. Then, an insulation layer 53 is deposited on the first semiconductor layer 52 by a CVD method or the like. It should be noted that a silicon oxide film, for example, can be used as the material of the insulation layer 53.

Figure 2A:
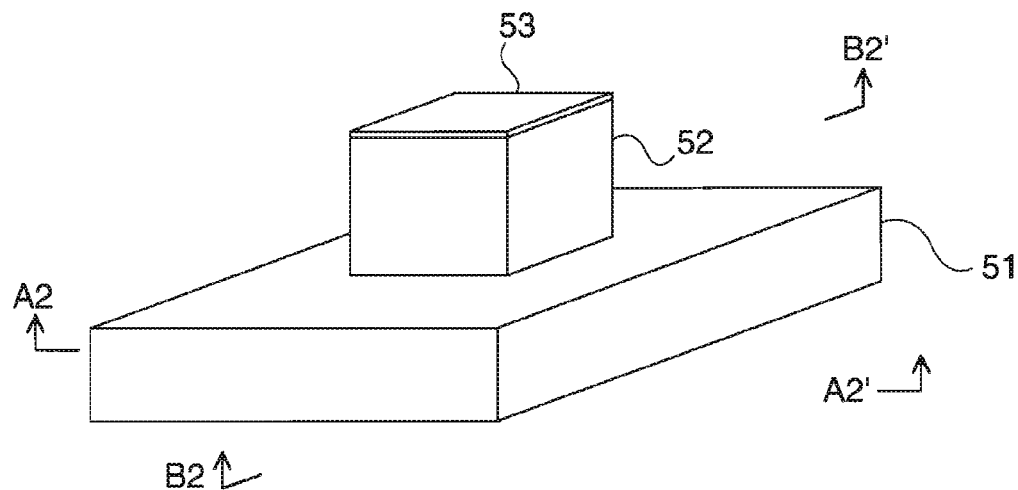
FIGS. 2A through 2C are diagrams showing the method of manufacturing a semiconductor device according to the first embodiment of the invention.
Figure 2B:
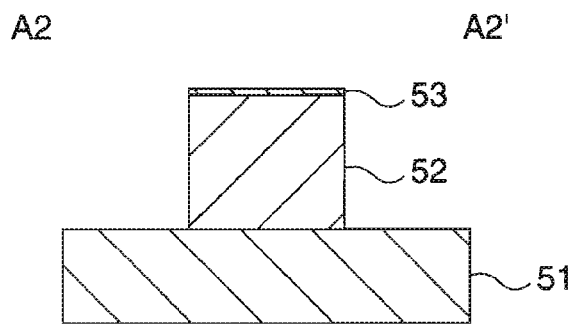
Figure 2C:
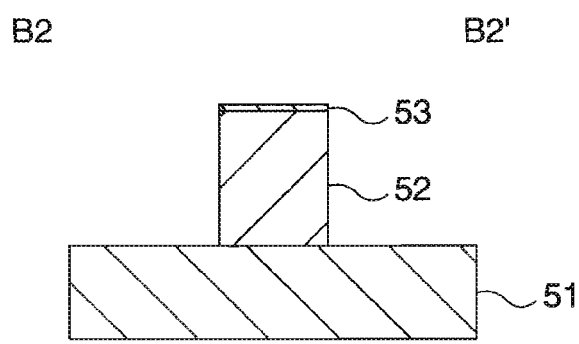

Subsequently, as shown in FIGS. 2A through 2C, the insulation layer 53 and the first semiconductor layer 52 are patterned using a photolithography method and an etching method to form a lug section exposing a sidewall of the first semiconductor 52 on the semiconductor substrate 51. In the case of forming the lug section exposing the sidewall of the first semiconductor layer 52 on the semiconductor substrate 51, it is arranged to expose the semiconductor substrate 51 around the first semiconductor layer 52. It should be noted that as the shape of patterning the first semiconductor layer 52, for example, a fin shape, a grid shape, or a net shape can be adopted besides the lug shape.

Figure 3A:
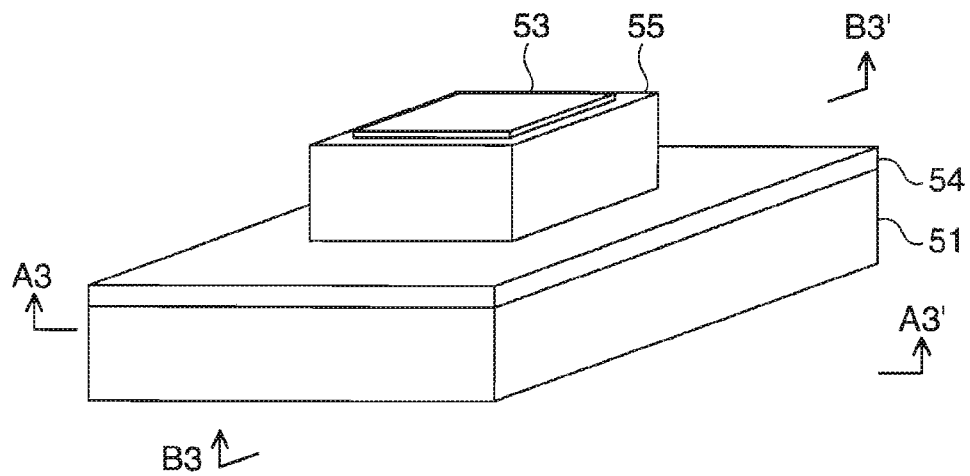
FIGS. 3A through 3C are diagrams showing the method of manufacturing a semiconductor device according to the first embodiment of the invention.
Figure 3B:
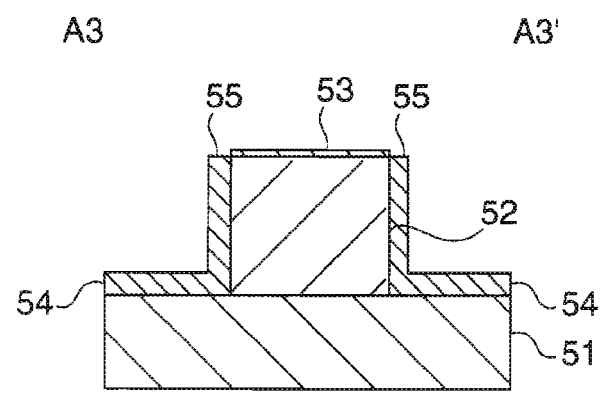
Figure 3C:
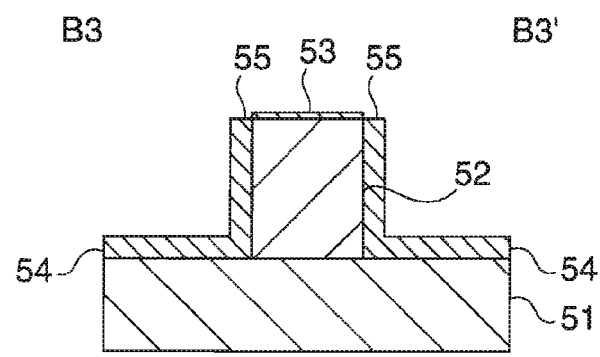

Subsequently, as shown in FIGS. 3A through 3C, by using selected epitaxial growth, a second semiconductor layer 55 is formed on the sidewall of the lug section of the first semiconductor 52. It should be noted here that, since the semiconductor substrate 51 surrounding the lug section of the first semiconductor layer 52 is exposed, the second semiconductor layer 54 is also formed on the surface of the semiconductor substrate 51 while forming the second semiconductor layer 55 on the sidewall of the lug section of the first semiconductor layer 52. Further, since the second semiconductor layers 54, 55 are not formed on the insulation layer 53 in the epitaxial growth of the second semiconductor layers 54, 55, it is possible to form the second semiconductor layers 55, 54 only on the surface of the sidewall of the lug section of the first semiconductor layer 52 and the surface of the semiconductor substrate 51, respectively.

It should be noted that a material having etching rate higher than those of the semiconductor substrate 51 and the second semiconductor layers 54, 55 can be used as the material of the first semiconductor layer 52. As the materials of the semiconductor substrate 51, the first semiconductor layer 52, and the second semiconductor layers 54, 55, combinations of the materials selected from, for example, Si, Ge, SiGe, SiC, SiSn, PbS, GaAs, InP, GaP, GaN, and ZnSe can be used. In particular, in the case of using the semiconductor substrate 51 made of Si, it is preferable to use SiGe as the first semiconductor layer 52, and Si as the second semiconductor layers 54, 55. Accordingly, the difference in the etching rates between the first semiconductor layer 52 and the second semiconductor layers 54, 55 can be assured while matching the first semiconductor layer 52 and the second semiconductor layers 54, 55 to each other, thus the second semiconductor layers 54, 55 with preferable crystal quality can be formed on the sidewall of the first semiconductor layer 52.

Figure 4A:
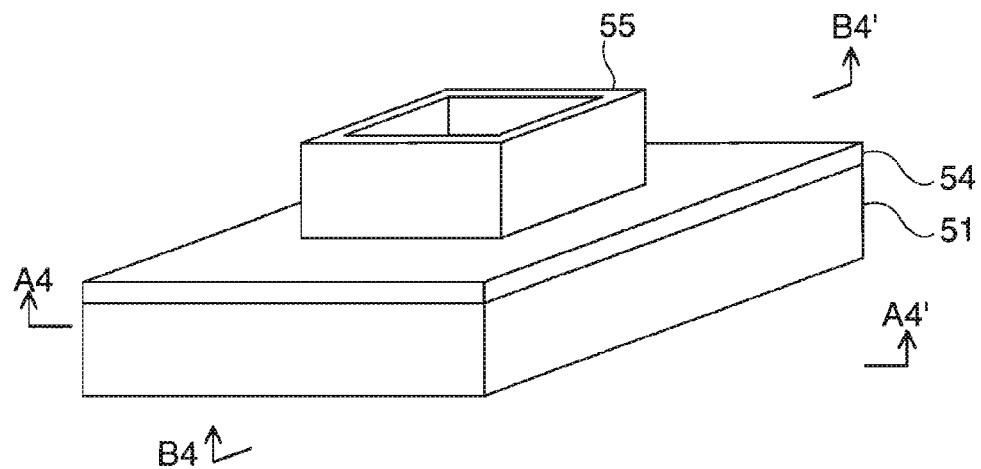
FIGS. 4A through 4C are diagrams showing the method of manufacturing a semiconductor device according to the first embodiment of the invention.
Figure 4B:
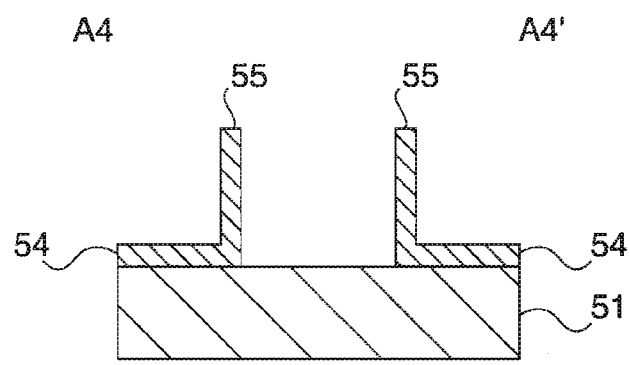
Figure 4C:
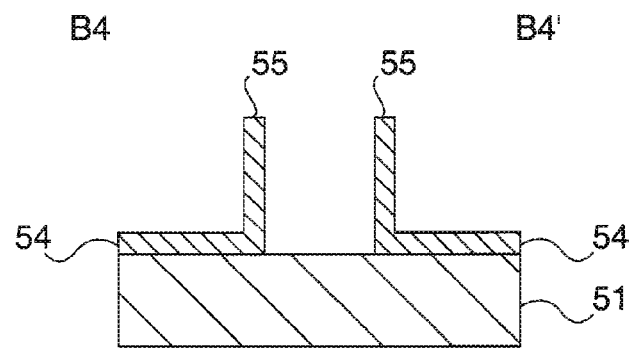

Subsequently, as shown in FIGS. 4A through 4C, the first semiconductor layer 52 is removed by etching by contacting an etching gas or an etching liquid to the first semiconductor layer 52 after removing the insulation film 53 on the first semiconductor layer 52. It should be noted that in the case in which the second semiconductor layers 54, 55 are made of Si and the first semiconductor layer 52 is made of SiGe, hydrofluoric/nitric acid (mixture of hydrofluoric acid, nitric acid, and water) is preferably used as the etching liquid for the first semiconductor layer 52. Thus, the selection ratio between Si and SiGe of about 1:100 through 1:1000 can be obtained, and accordingly, it becomes possible to remove the first semiconductor layer 52 while preventing overetching of the second semiconductor layers 54, 55. Further, hydrofluoric/nitric acid hydrogen peroxide water, ammonia hydrogen peroxide water, or hydrofluoric/acetic acid hydrogen peroxide water can also be used as the etching liquid for the first semiconductor layer 52.

Figure 5A:
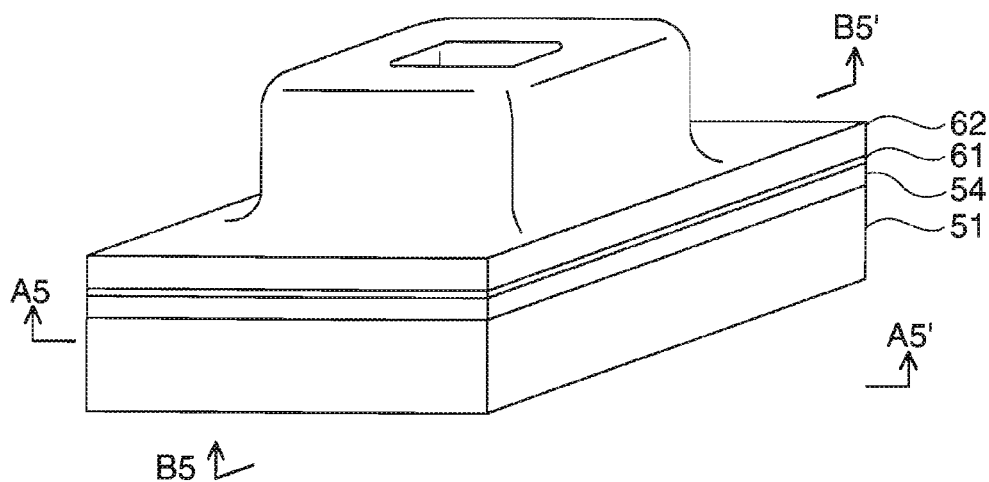
FIGS. 5A through 5C are diagrams showing the method of manufacturing a semiconductor device according to the first embodiment of the invention.
Figure 5B:
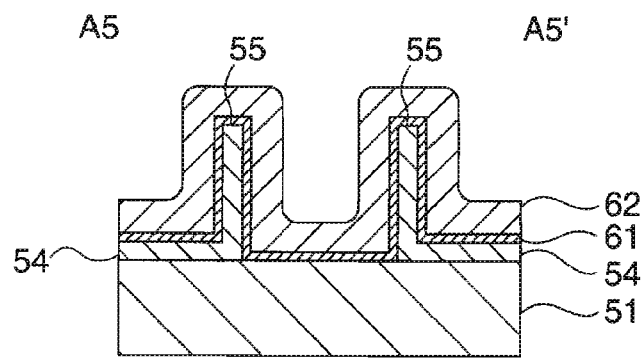
Figure 5C:
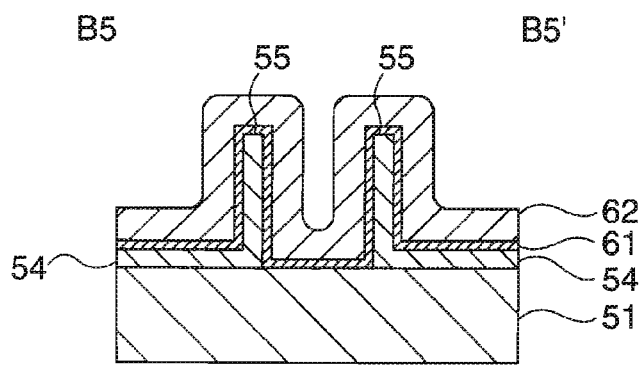

Subsequently, as shown in FIGS. 5A through 5C, a base oxide film 61 is formed on the surface of the second semiconductor layers 54, 55 by performing thermal oxidation on the second semiconductor layer 54, 55. Then, an antioxidant film 62 is formed on the entire surface of the base oxide film 61 by a CVD method or the like. It should be noted that a silicon nitride film, for example, can be used as the antioxidant film 62.

Figure 6A:
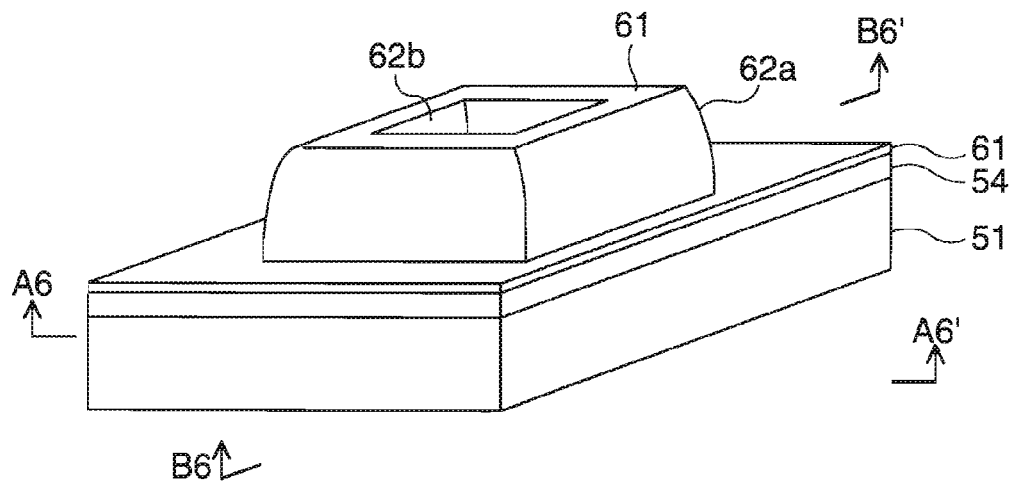
FIGS. 6A through 6C are diagrams showing the method of manufacturing a semiconductor device according to the first embodiment of the invention.
Figure 6B:
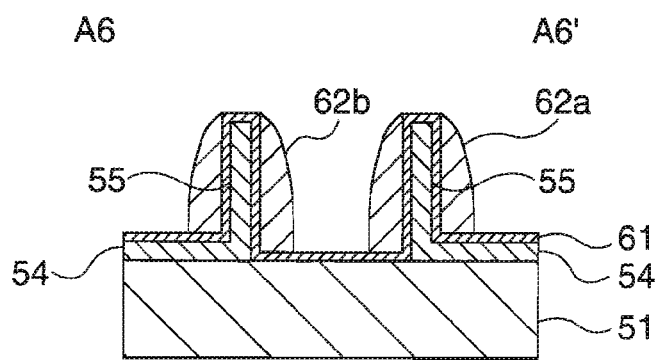
Figure 6C:
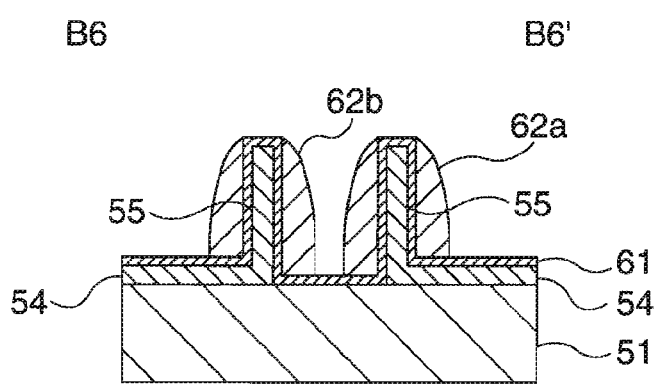

Subsequently, as shown in FIGS. 6A through 6C, sidewalls 62a, 62b are respectively formed on the sidewalls of the second semiconductor layer 55 by etching back the antioxidant film 62 using an anisotropic etching such as an RIE. It should be noted that as the antioxidant film 62, for example, a silicon nitride film or a stacked layer composed of a silicon oxide film and a silicon nitride film can be used.

Figure 7A:
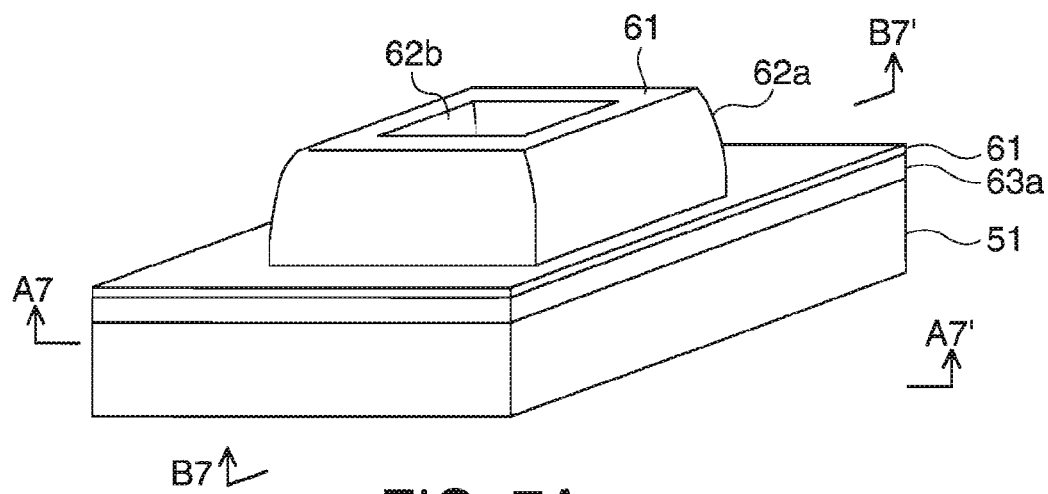
FIGS. 7A through 7C are diagrams showing the method of manufacturing a semiconductor device according to the first embodiment of the invention.
Figure 7B:
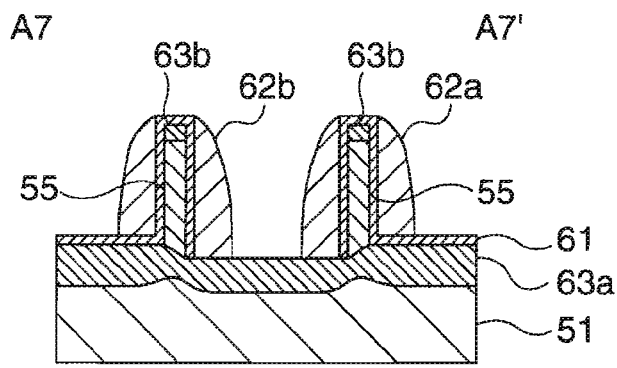
Figure 7C:
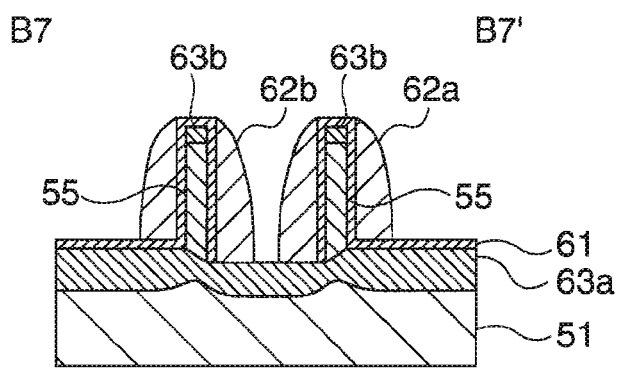

Subsequently, as shown in FIGS. 7A thorough 7C, an embedded oxide film 63a covering the surface of the semiconductor substrate 51 and embedded between the semiconductor substrate 51 and the second semiconductor layer 55 is formed by performing selective oxidation of the semiconductor substrate 51 and the second semiconductor layer 55 using the sidewalls 62a, 62b as the mask. In this case, since the upper end of the second semiconductor layer 55 is exposed from the antioxidant film 62 in forming the sidewalls 62a, 62b on the sidewalls of the second semiconductor layer 55, an upper oxide film 63b is formed on the upper end of the second semiconductor layer 55.

Figure 8A:
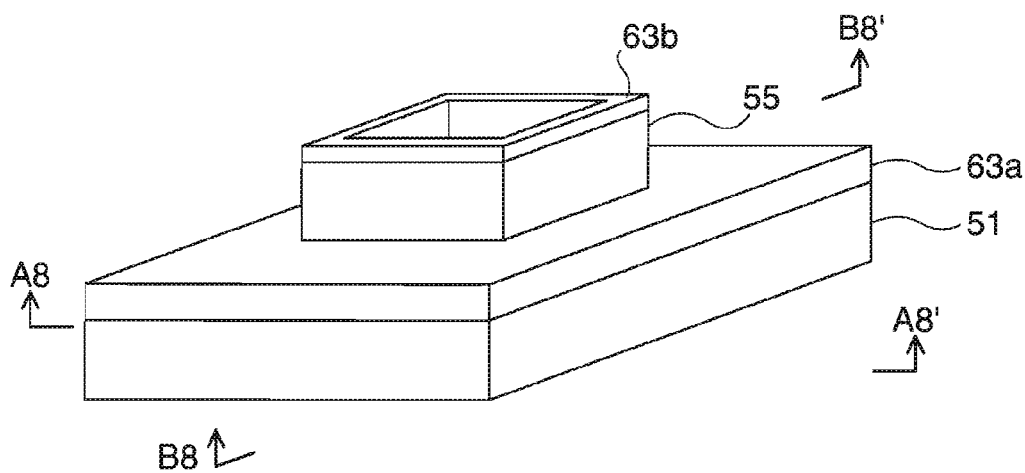
FIGS. 8A through 8C are diagrams showing the method of manufacturing a semiconductor device according to the first embodiment of the invention.
Figure 8B:
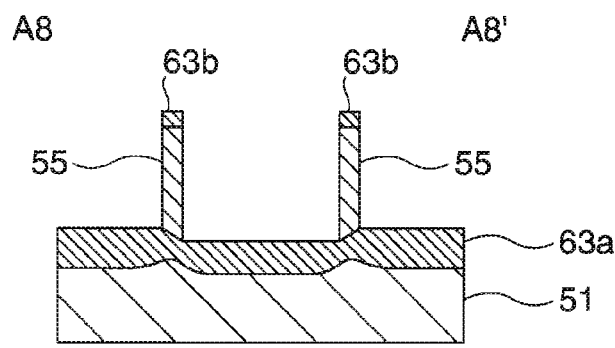
Figure 8C:
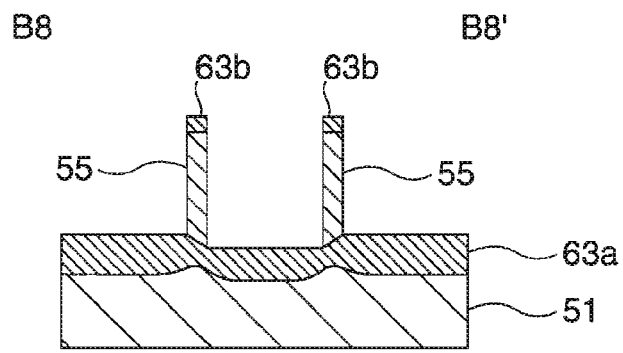

Subsequently, as shown in FIGS. 8A through 8C, the sidewalls of the second semiconductor layer 55 are exposed by removing the sidewalls 62a, 62b from the sidewalls of the second semiconductor layer 55.

Figure 9A:
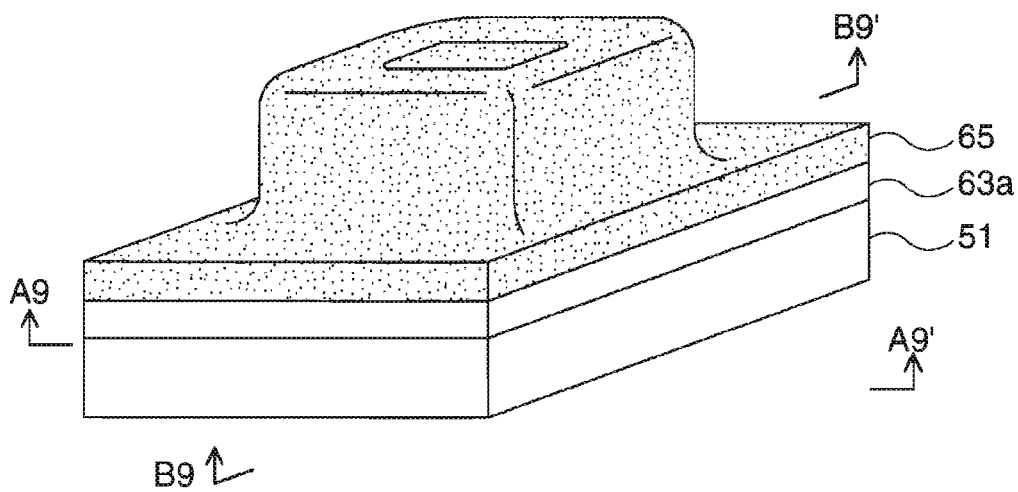
FIGS. 9A through 9C are diagrams showing the method of manufacturing a semiconductor device according to the first embodiment of the invention.
Figure 9B:
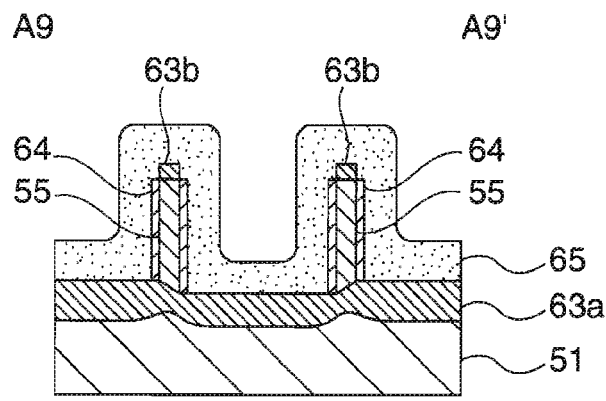
Figure 9C:
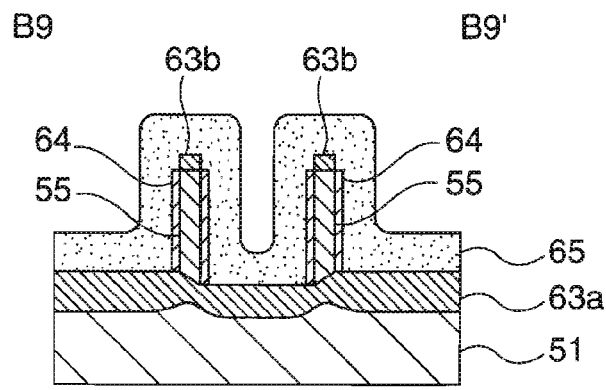

Subsequently, as shown in FIGS. 9A through 9C, a gate insulation film 64 is formed on the sidewall surface of the second semiconductor layer 55 by performing a thermal oxidation process of the sidewall surface of the second semiconductor layer 55, an ALD process, or a CVD process. Then, a polycrystal silicon layer 65 is formed on the embedded oxide film 63a by a CVD method or the like so as to entirely cover the second semiconductor layer 55 on which the gate insulation layer 64 is formed.

Figure 10A:
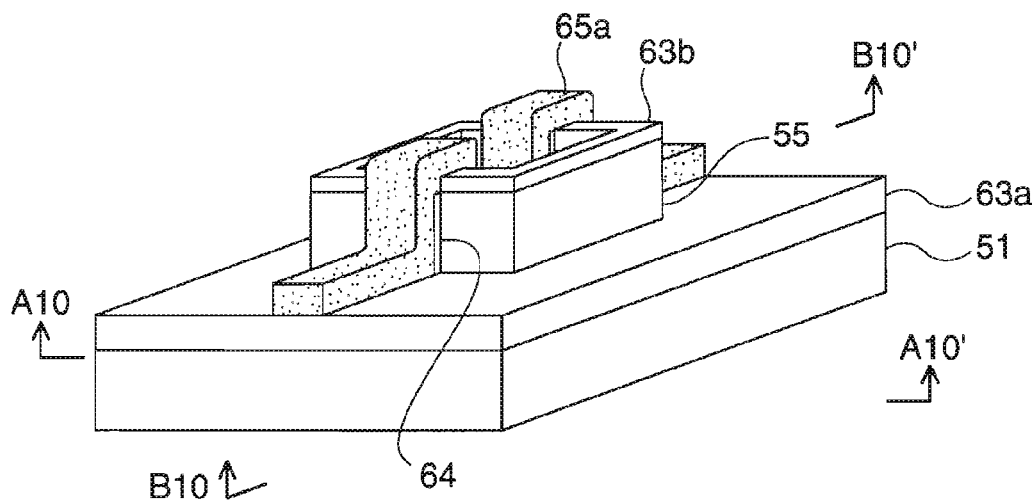
FIGS. 10A through 10C are diagrams showing the method of manufacturing a semiconductor device according to the first embodiment of the invention.
Figure 10B:
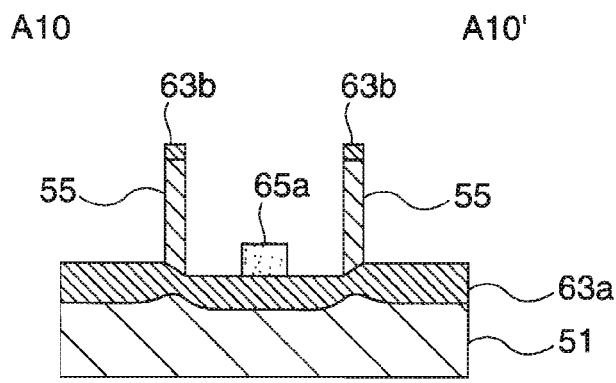
Figure 10C:
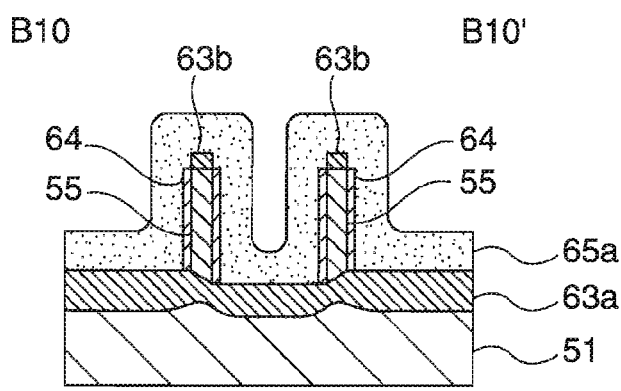

Subsequently, as shown in FIGS. 10A through 10C, a gate electrode 65a disposed so as to straddle the second semiconductor layer 55 along the sidewall of the second semiconductor 55 is formed on the embedded oxide film 63a by patterning the polysilicon layer 65 using a photolithography method and an etching method.

Figure 11A:
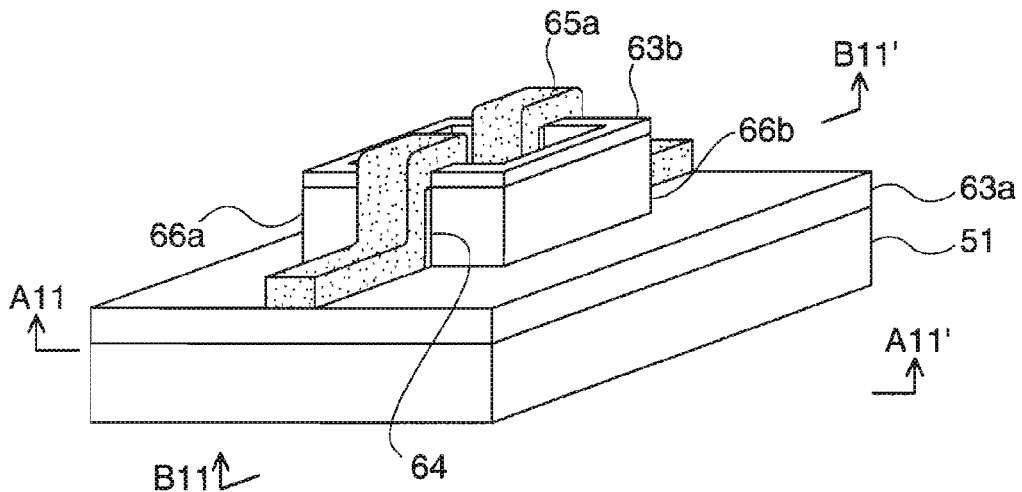
FIGS. 11A through 11C are diagrams showing the method of manufacturing a semiconductor device according to the first embodiment of the invention.
Figure 11B:
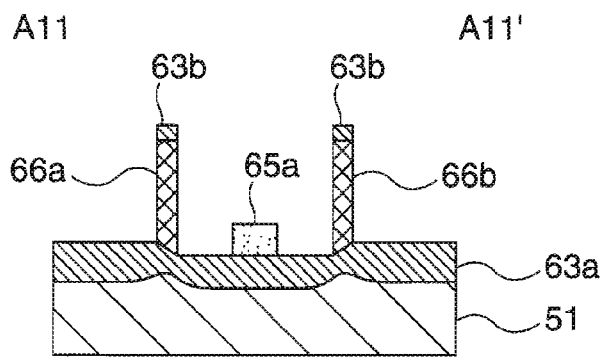
Figure 11C:
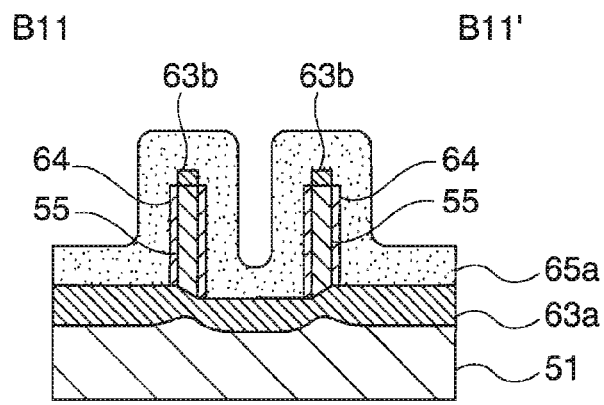

Subsequently, as shown in FIGS. 11A through 11C, source/drain layers 66a, 66b respectively disposed on the sides of the gate electrode 65a are formed in the second semiconductor layer 55 by ion-implanting the impurities such as As, P, or B using the gate electrode 65a as the mask.

Thus, the epitaxial growth of the second semiconductor layer 55 on the sidewall of the first semiconductor layer 52 becomes possible, and it becomes also possible to have a channel on the film surface of the second semiconductor layer 55 formed on the sidewall of the first semiconductor layer 52. Further, the second semiconductor layer 55 can be disposed on the embedded oxide film 63a by performing the selective oxidation of the second semiconductor layer 55 and the semiconductor substrate 51 using the sidewalls 62a, 62b as a mask without using an SOI substrate. Therefore, even in the case in which the channel is provided on the sidewall of the second semiconductor layer 55, the insulation between the second semiconductor layer 55 and the semiconductor substrate 51 can be achieved while preventing the damage by the dry etching process from extending over the channel, and the film thickness of the second semiconductor layer 55 on which the channel is formed can be controlled with the epitaxial growth. As a result, it becomes possible to prevent defect from being generated in the channel region, and further, even in the case in which the channel is provided on the sidewall of the second semiconductor layer 55, the stable thickness control of the second semiconductor layer becomes possible while achieving the thinned second semiconductor layer 55. Moreover, the integration density of the transistors can be enhanced while keeping the current driving capacity, and further, stable and superior electrical characteristics can be obtained, Further, by embedding the embedded oxide film 63a between the semiconductor substrate 51 and the second semiconductor layer 55, the source/drain junction capacitance can be reduced while preventing latch-up phenomenon, thus lower power consumption and higher speed can be achieved, and further, low voltage drive can easily be realized.

It should be noted that, although in the embodiment described above, there is explained the method of forming the second semiconductor layer 55 by the epitaxial growth on the sidewalls of the first semiconductor layer 52 formed on the semiconductor substrate 51 for forming the fin shaped second semiconductor layer 55 on the semiconductor substrate 51, it is also possible to process the surface of the semiconductor substrate 51 to have the fin shape by a method such as photo etching.

Second Embodiment

Figure 12A:
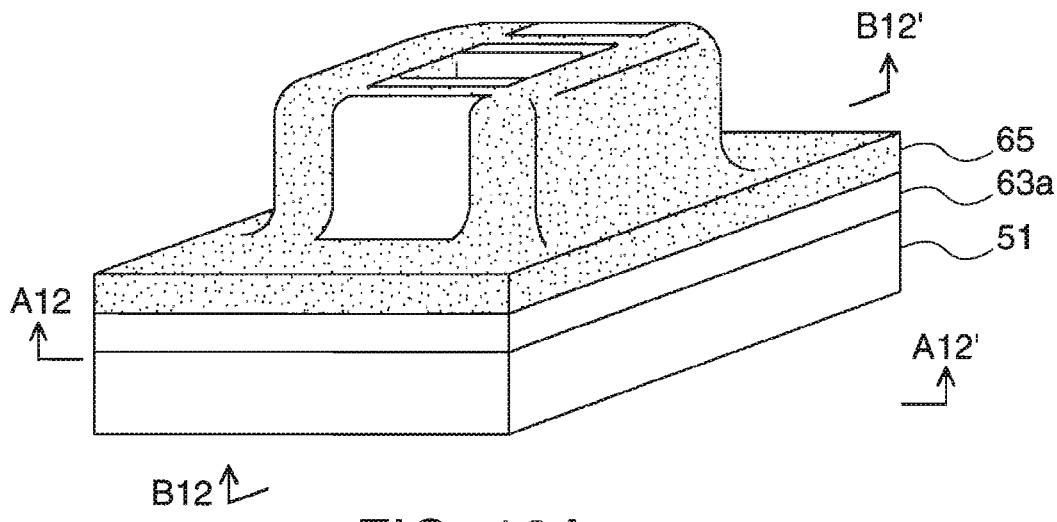
FIGS. 12A through 12C are diagrams showing a method of manufacturing a semiconductor device according to a second embodiment of the invention.
Figure 12B:
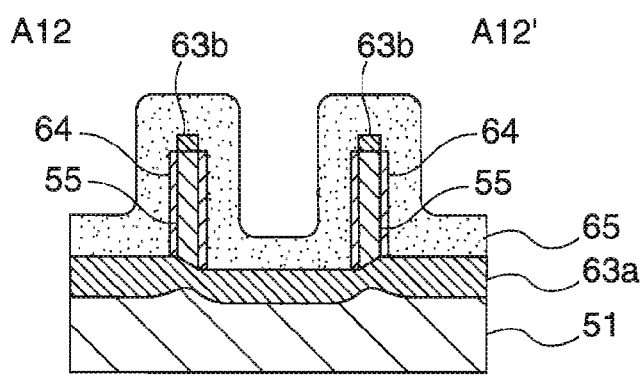
Figure 12C:
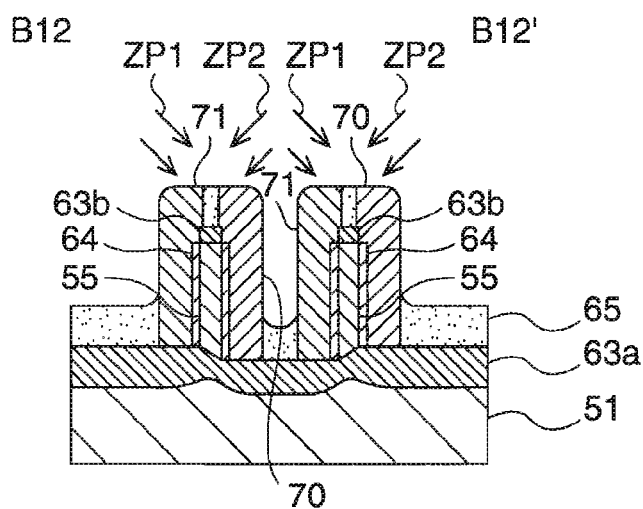
Figure 13A:
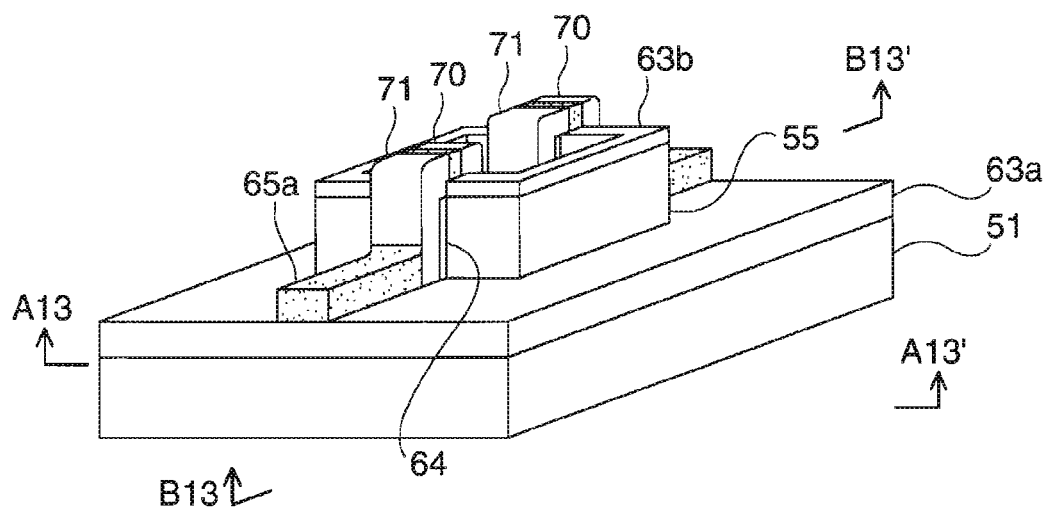
FIGS. 13A through 13C are diagrams showing the method of manufacturing a semiconductor device according to the second embodiment of the invention.
Figure 13B:
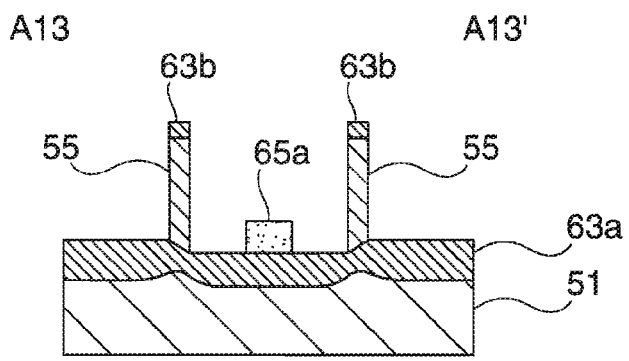
Figure 13C:
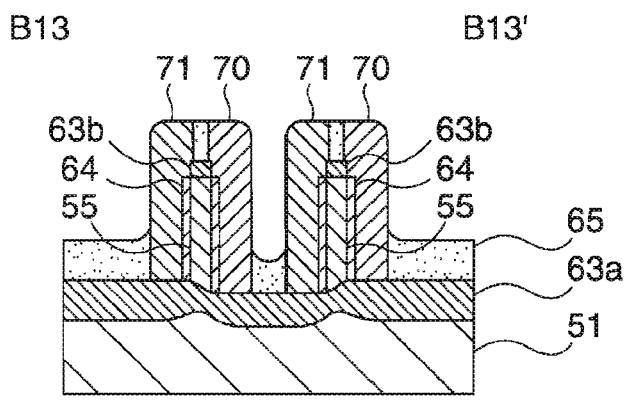
Figure 14A:
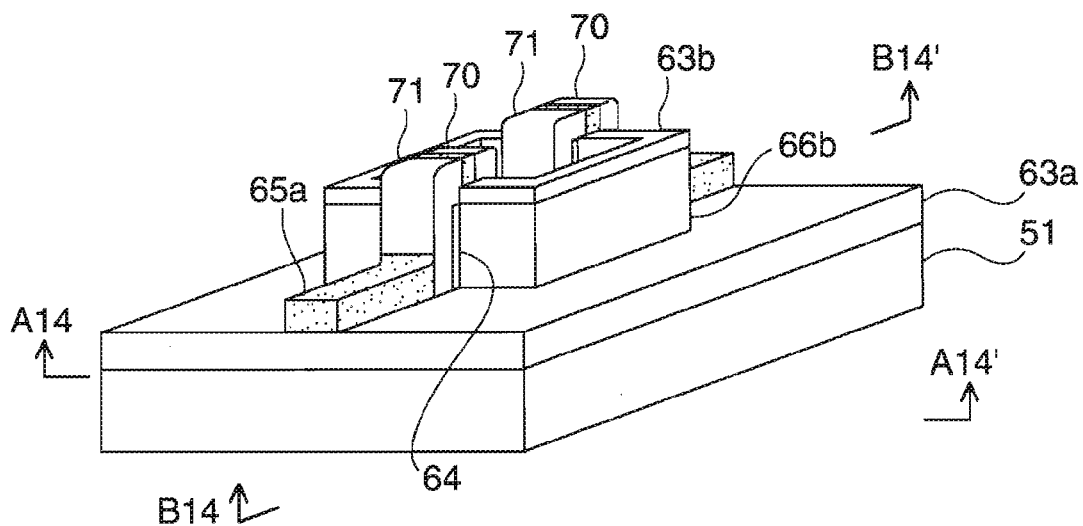
FIGS. 14A through 14C are diagrams showing the method of manufacturing a semiconductor device according to the second embodiment of the invention.
Figure 14B:
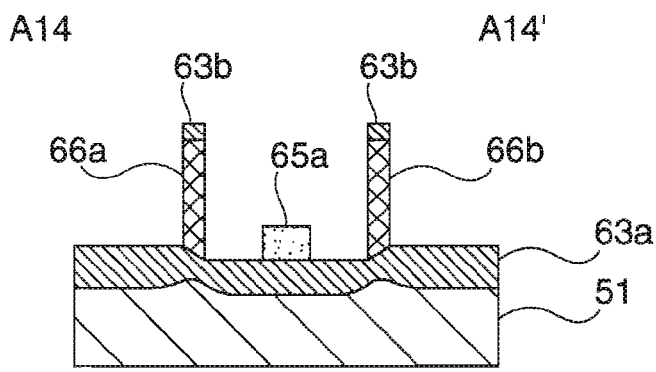
Figure 14C:
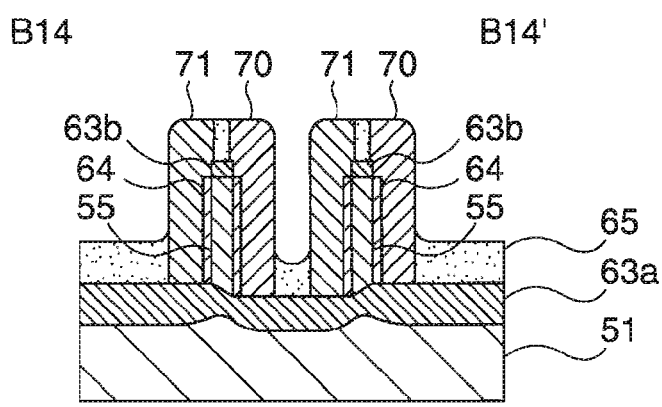

FIGS. 12A, 13A, and 14A are perspective views showing a method of manufacturing a semiconductor device according to a second embodiment of the invention, FIGS. 12B, 13B, and 14B are cross sectional views along the A12-A12' line through A14-A14' line in FIGS. 12A, 13A, and 14A, respectively, FIGS. 12C, 13C, and 14C are cross sectional views along the B12-B12' line through B14-B14' line in FIGS. 12A, 13A, and 14A, respectively.

In the second embodiment, the processes on and before the process for forming the polysilicon layer 65 shown in FIGS. 9A through 9C are the same as those of the first embodiment, for example. Therefore, in FIGS. 1A through 1C, the first semiconductor layer 52 is formed as a film on the semiconductor substrate 51 by epitaxial growth. Then, the insulation layer 53 is deposited on the first semiconductor layer 52 by a CVD method or the like. It should be noted that a silicon oxide film, for example, can be used as the material of the insulation layer 53.

Subsequently, as shown in FIGS. 2A through 2C, the insulation layer 53 and the first semiconductor layer 52 are patterned using a photolithography method and an etching method to form the lug section exposing the sidewall of the first semiconductor 52 on the semiconductor substrate 51. In the case of forming the lug section exposing the sidewall of the first semiconductor layer 52 on the semiconductor substrate 51, it is arranged to expose the semiconductor substrate 51 around the first semiconductor layer 52. It should be noted that as the shape of patterning the first semiconductor layer 52, for example, a fin shape, a grid shape, or a net shape can be adopted besides the lug shape.

Subsequently, as shown in FIGS. 3A through 3C, by using selected epitaxial growth, the second semiconductor layer 55 is formed on the sidewall of the lug section of the first semiconductor 52. It should be noted here that, since the semiconductor substrate 51 surrounding the lug section of the first semiconductor layer 52 is exposed, the second semiconductor layer 54 is also formed on the surface of the semiconductor substrate 51 while forming the second semiconductor layer 55 on the sidewall of the lug section of the first semiconductor layer 52. Further, since the second semiconductor layers 54, 55 are not formed on the insulation layer 53 in the epitaxial growth of the second semiconductor layers 54, 55, it is possible to form the second semiconductor layers 55, 54 only on the surface of the sidewall of the lug section of the first semiconductor layer 52 and the surface of the semiconductor substrate 51, respectively.

It should be noted that a material having etching rate higher than those of the semiconductor substrate 51 and the second semiconductor layers 54, 55 can be used as the material of the first semiconductor layer 52. As the materials of the semiconductor substrate 51, the first semiconductor layer 52, and the second semiconductor layers 54, 55, combinations of the materials selected from, for example, Si, Ge, SiGe, SiC, SiSn, PbS, GaAs, InP, GaP, GaN, and ZnSe can be used. In particular, in the case of using the semiconductor substrate 51 made of Si, it is preferable to use SiGe as the first semiconductor layer 52, and Si as the second semiconductor layers 54, 55. Accordingly, the difference in the etching rates between the first semiconductor layer 52 and the second semiconductor layers 54, 55 can be assured while matching the first semiconductor layer 52 and the second semiconductor layers 54, 55 to each other, thus the second semiconductor layers 54, 55 with preferable crystal quality can be formed on the sidewall of the first semiconductor layer 52.

Subsequently, as shown in FIGS. 4A through 4C, the first semiconductor layer 52 is removed by etching by contacting an etching gas or an etching liquid to the first semiconductor layer 52 after removing the insulation film 53 on the first semiconductor layer 52. It should be noted that in the case in which the second semiconductor layers 54, 55 are made of Si and the first semiconductor layer 52 is made of SiGe, hydrofluoric/nitric acid (mixture of hydrofluoric acid, nitric acid, and water) is preferably used as the etching liquid for the first semiconductor layer 52. Thus, the selection ratio between Si and SiGe of about 1:100 through 1:1000 can be obtained, and accordingly, it becomes possible to remove the first semiconductor layer 52 while preventing the second semiconductor layers 54, 55 from over etching. Further, hydrofluoric/nitric acid hydrogen peroxide water, ammonia hydrogen peroxide water, or hydrofluoric/acetic acid hydrogen peroxide water can also be used as the etching liquid for the first semiconductor layer 52.

Subsequently, as shown in FIGS. 5A through 5C, the base oxide film 61 is formed on the surface of the second semiconductor layers 54, 55 by performing thermal oxidation on the second semiconductor layer 54, 55. Then, the antioxidant film 62 is formed on the entire surface of the base oxide film 61 by a CVD method or the like. It should be noted that a silicon nitride film, for example, can be used as the antioxidant film 62.

Subsequently, as shown in FIGS. 6A through 6C, the sidewalls 62a, 62b are respectively formed on the sidewalls of the second semiconductor layer 55 by etching back the antioxidant film 62 using an anisotropic etching such as an RIE. It should be noted that a silicon nitride film, for example, can be used as the antioxidant film 62.

Subsequently, as shown in FIGS. 7A thorough 7C, the embedded oxide film 63a covering the surface of the semiconductor substrate 51 and embedded between the semiconductor substrate 51 and the second semiconductor layer 55 is formed by performing selective oxidation of the semiconductor substrate 51 and the second semiconductor layer 55 using the sidewalls 62a, 62b as the mask. In this case, since the upper end of the second semiconductor layer 55 is exposed from the antioxidant film 62 in forming the sidewalls 62a, 62b on the sidewalls of the second semiconductor layer 55, an upper oxide film 63b is formed on the upper end of the second semiconductor layer 55.

Subsequently, as shown in FIGS. 8A through 8C, the sidewalls of the second semiconductor layer 55 are exposed by removing the sidewalls 62a, 62b from the sidewalls of the second semiconductor layer 55.

Subsequently, as shown in FIGS. 9A through 9C, the gate insulation film 64 is formed on the sidewall surface of the second semiconductor layer 55 by performing a thermal oxidation process of the sidewall surface of the second semiconductor layer 55. Then, the polycrystal silicon layer 65 is formed on the embedded oxide film 63a by a CVD method or the like so as to entirely cover the second semiconductor layer 55 on which the gate insulation layer 64 is formed. It should be noted that a silicide layer such as $MoSi_2$, $CoSi_2$, $TiSi_2$, or $NiSi_2$ can also be used instead of the polysilicon layer 65. Further, a stacked layer composed of the silicide layer and the polysilicon layer can also be adopted.

After thus forming the polysilicon layer 65, as shown in FIGS. 12A through 12C, an impurity introduction layers 70, 71 provided to have different concentration or polarity for every surface of sidewalls are respectively formed in the polysilicon layer 65 by performing rotating tilted ion implantation on the polysilicon layer 65. For example, the impurity introduction layer 70 can be set to have a polarity of P-type by implanting III group element ions such as B or $BF_2$ while the impurity introduction layer 71 can be set to have a polarity of N-type by implanting V group element ions such as As or P. Further, in the method of manufacturing a semiconductor device including a plurality of transistors according to an embodiment of the invention, by using the photolithography method (selective ion-implantation with a resist mask) in conjunction therewith, the concentrations and the polarities of the impurity introduction layers 70, 71 can be made different from each other. It should be noted here that, in some transistors, the combination of the regions 70, 71 on the both side faces of the polysilicon layer 65 formed on the sidewalls of the semiconductor 55 implanted with the same polarity and concentration of impurities is obviously possible. It should also be noted that the angle of the tilted ion implantation is preferably set so that the impurities can be implanted into nearly the bottom of the polysilicon layer 65 formed on the sidewall of the second semiconductor layer 55. Further, it is also possible to form the impurity introduction layers 70, 71 electrically so as to be connected to each other by forming a silicide layer on the polysilicon layer 65 in which the impurity introduction layers 70, 71 are formed.

Subsequently, as shown in FIGS. 13A through 13C, a gate electrode 65a disposed so as to straddle the second semiconductor layer 55 along the sidewall of the second semiconductor 55 is formed on the embedded oxide film 63a by patterning the polysilicon layer 65 using a photolithography method and an etching method.

Subsequently, as shown in FIGS. 14A through 14C, source/drain layers 66a, 66b respectively disposed on the sides of the gate electrode 65a are formed in the second semiconductor layer 55 by ion-implanting the impurities such as As, P, or B using the gate electrode 65a as the mask.

Thus, the epitaxial growth of the second semiconductor layer 55 on the sidewall of the first semiconductor layer 52 becomes possible, and it becomes also possible to have a channel on the film surface of the second semiconductor layer 55 formed on the sidewall of the first semiconductor layer 52. Further, the second semiconductor layer 55 can be disposed on the embedded oxide film 63a by performing the selective oxidation of the second semiconductor layer 55 and the semiconductor substrate 51 using the sidewalls 62a, 62b as a mask without using an SOI substrate. Therefore, even in the case in which the channel is provided on the sidewall of the second semiconductor layer 55, the insulation between the second semiconductor layer 55 and the semiconductor substrate 51 can be achieved while preventing the damage by the dry etching process from extending over the channel, and the film thickness of the second semiconductor layer 55 on which the channel is formed can be controlled with the epitaxial growth.

As a result, it becomes possible to prevent defect from being generated in the channel region, and further, even in the case in which the channel is provided on the sidewall of the second semiconductor layer 55, the stable thickness control of the second semiconductor layer 55 becomes possible while achieving the thinned second semiconductor layer 55. Moreover, the integration density of the transistors can be enhanced while keeping the current driving capacity, and further, stable and superior electrical characteristics can be obtained. Further, by embedding the embedded oxide film 63a between the semiconductor substrate 51 and the second semiconductor layer 55, the source/drain junction capacitance can be reduced while preventing latch-up phenomenon, thus lower power consumption and higher speed can be achieved, and further, low voltage drive can easily be realized.

Further, since the impurity introduction layers 70, 71, which are set to have different concentrations and polarities for every face of the sidewalls of the second semiconductor layer 55 are formed in the gate electrode 65a, the potentials of the second semiconductor layer 55 in the both side faces and in the body region can be determined by the gate electrode 65a disposed on both side faces of the second semiconductor layers 55. Therefore, it becomes possible to lower the impurity concentration of the second semiconductor layer 55 while allowing stable threshold control of the transistor disposed on the sidewalls of the second semiconductor layer 55, thus enhancing the mobility of the field-effect transistor and increasing the on-current. Further, since the impurity concentration of the second semiconductor layer 55 can be lowered, even in the case in which the second semiconductor layer 55 is formed as a thick film, it becomes possible to obtain a steep sub-threshold to allow reduction of the characteristic variation, which allows enhancing manufacturing yield to realize cost reduction.

Further, since the gate electrodes 65a on the sidewalls of the both sides of the second semiconductor layer 55 are connected to each other with the silicide layer, even in the case in which the body region on the second semiconductor layer 55 is doped intrinsically or in low concentration, the threshold can be changed in a range of about one volt by appropriately selecting the polarities of the gate electrodes 65a on the sidewalls of the both sides of the second semiconductor layer 55, thus enhancing the mobility of the field-effect transistor to increase the on-current.

It should be noted that, although in the embodiment described above, there is explained the method of forming the second semiconductor layer 55 by the epitaxial growth on the sidewalls of the first semiconductor layer 52 formed on the semiconductor substrate 51 for forming the fin shaped second semiconductor layer 55 on the semiconductor substrate 51, it is also possible to process the surface of the semiconductor substrate 51 to have the fin shape by a method such as photo etching.

Further, although in the embodiments described above, there is described the method of forming the embedded oxide film 63a between the second semiconductor layer 55 and the semiconductor substrate 51 in order for insulating the fin shaped second semiconductor layer 55 from the semiconductor substrate 51, it is also possible to form the SOI layer of the SOI substrate to have the fin shape.

What is claimed is:

1. A semiconductor device comprising:
a semiconductor layer partially formed on a semiconductor substrate by epitaxial growth;
an embedded oxide film embedded between the semiconductor substrate and the semiconductor layer;
a gate electrode disposed on sidewalls of the semiconductor layer;
a source layer formed in the semiconductor layer, the source layer is disposed on one side of the gate electrode; and
a drain layer formed in the semiconductor layer, the drain layer being disposed on the other side of the gate electrode,
wherein the sidewalls of the semiconductor layer are film-forming surfaces of the epitaxial growth, and the sidewalls of the semiconductor layer form an outer boundary of the semiconductor device, the semiconductor device forming the shape of an opened box.

2. The semiconductor device according to claim 1, wherein the gate electrode is formed on the sidewalls of the both sides of the semiconductor layer so as to straddle the semiconductor layer.

3. The semiconductor device according to claim 1, wherein the semiconductor layer has one of a lug shape, a fin shape, a grid shape and a net shape.

4. The semiconductor device according to claim 1, the semiconductor layer having a channel in a sidewall.

* * * * *